United States Patent [19]
Barrow

[11] Patent Number: 5,875,102
[45] Date of Patent: Feb. 23, 1999

[54] ECLIPSE VIA IN PAD STRUCTURE

[75] Inventor: Michael Barrow, El Dorado Hills, Calif.

[73] Assignee: Intel Corporation, Santa Clara, Calif.

[21] Appl. No.: 832,482

[22] Filed: Apr. 2, 1997

Related U.S. Application Data

[63] Continuation-in-part of Ser. No. 603,444, Feb. 20, 1996, Pat. No. 5,706,178, which is a continuation-in-part of Ser. No. 575,917, Dec. 20, 1995.

[51] Int. Cl.⁶ .............................. H01L 25/00; H05K 7/02
[52] U.S. Cl. ...................... 361/777; 361/774; 361/760; 361/772; 361/7; 257/692; 257/698; 257/774; 257/724; 174/52.4; 174/260; 174/261; 174/262; 174/263; 174/264; 174/265; 174/266; 228/180.21; 228/180.22; 439/68; 439/83; 437/209; 437/211; 437/215
[58] Field of Search .................................. 361/777, 774, 361/760, 772; 174/52.4, 260, 261, 262, 263, 264, 265, 266; 228/180.21, 180.22; 257/692, 698, 723, 724, 737, 738, 735, 774, 778, 779, 786; 439/68, 83; 437/209, 211, 215

[56] References Cited

U.S. PATENT DOCUMENTS

| | | |
|---|---|---|
| 5,216,278 | 6/1993 | Lin et al. . |
| 5,468,999 | 11/1995 | Lin et al. ................................. 257/784 |
| 5,583,376 | 12/1996 | Sickler et al. ........................... 257/702 |
| 5,591,941 | 1/1997 | Acocella et al. ......................... 174/266 |
| 5,637,832 | 6/1997 | Danner .................................... 174/260 |
| 5,706,178 | 1/1998 | Barrow .................................... 361/777 |

Primary Examiner—Leo P. Picard
Assistant Examiner—David Foster
Attorney, Agent, or Firm—Blakely, Sokoloff, Taylor & Zafman

[57] ABSTRACT

A ball grid array (BGA) integrated circuit package which has a plurality of vias connected to a plurality of solder pads located on a bottom surface of a package substrate. Each via has a portion located within a solder pad to increase the routing space of the substrate, and a portion located outside the solder pad to allow outgassing from the via. The bottom surface also has a solder mask which covers the vias and contains a number of holes that expose the solder pads. The holes allow solder balls to be attached to the solder pads. The solder balls can be reflowed to attach the package to a printed circuit board.

10 Claims, 3 Drawing Sheets

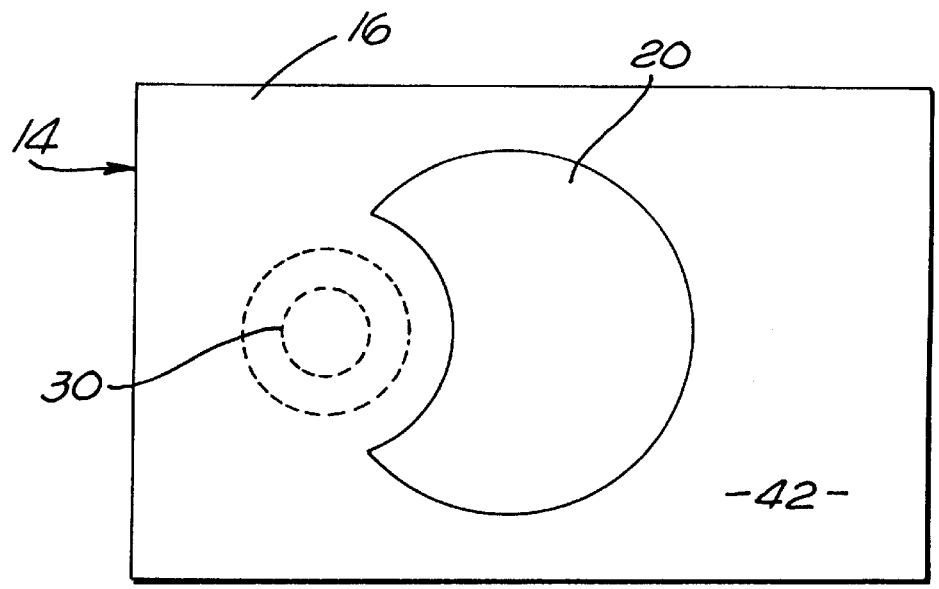
FIG. 8
FIG. 9
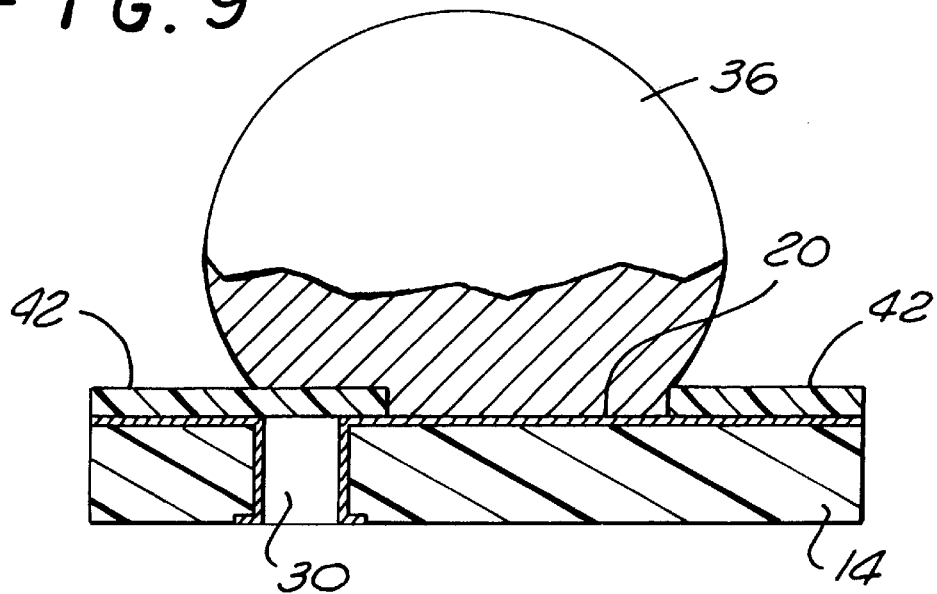

ECLIPSE VIA IN PAD STRUCTURE

CROSS-REFERENCES TO RELATED APPLICATIONS

This application is a continuation-in-part application of Application Ser. No. 08/603,444, filed Feb. 20, 1996, now U.S. Pat. No. 5,706,178 which is a continuation-in-part application of Application Ser. No. 08/575,917, filed Dec. 20, 1995.

BACKGROUND OF THE INVENTION

1. FIELD OF THE INVENTION

The present invention relates to a ball grid array integrated circuit package.

2. DESCRIPTION OF RELATED ART

Integrated circuits are typically housed within a plastic or ceramic package. Some integrated circuit packages contain a plurality of pins that extended from the package and are soldered to corresponding plated through holes in a printed circuit board. The plated through holes reduce the amount of routing space within the circuit board. Integrated circuits are typically designed to provide more digital signal inputs and outputs (I/O), which require additional routing within the printed circuit board. More electrical routing traces typically required additional layers or thinner trace line widths. Both solutions increase the cost of manufacturing a printed circuit board.

There has been developed electronic package assemblies which mount the integrated circuit package to the surface of the printed circuit board. The integrated circuit package has a number of pins or solder pads that are soldered to corresponding surface pads of the printed circuit board. The integrated circuit package is typically soldered to the printed circuit board by solder paste that is screened onto the surface pads before the package is mounted to the board. Surface mounted integrated circuit packages are typically constructed from co-fired ceramic or molded plastic material.

U.S. Pat. No. 5,216,278 issued to Lin et al. discloses a surface mounted package commonly referred to as a ball grid array (BGA). BGA packages are typically constructed with a substrate that supports the integrated circuit and which is constructed with conventional printed circuit board processes. The surface of the substrate opposite from the integrated circuit contains a plurality of solder pads. After the integrated circuit is mounted and attached to the substrate (and typically enclosed with an encapsulant) a solder ball is placed onto each solder pad. The solder balls are then heated and reflowed to attach the balls to the pads. The solder balls are then subsequently soldered to a printed circuit board to attach the package to the board. A pattern of solder mask is typically placed onto the surface of the substrate to prevent undesirable cross-wicking of solder between solder pads. To allow the solder balls to become attached to the solder pads, the solder mask has a plurality of openings located concentrically with the pads. The solder mask openings have a diameter that is less than the diameter of the solder pads.

As shown in FIG. 1, existing BGA packages have vias 2 that interconnect the solder pads 4 with the opposite side of the substrate. The vias 2 are separated from the solder pads 4 in a "dogbone" configuration. The bottom surface of the package has a layer of solder mask 6. As discussed in the Lin patent, the vias are separated from the solder pads so that solder does not flow into the vias.

By separating the vias from the solder pads, the dogbone configuration creates a less than optimal trace pattern which occupies valuable routing space on the surface of the substrate. It would be desirable to have a BGA package substrate that provides more routing space than substrates of the prior art.

The temperature of the package is elevated when the solder balls are reflowed onto the solder pads and elevated again when the solder balls are attached to the printed circuit board. The reflow process can vaporize moisture trapped in the barrels of the vias. It is important to provide a package construction that allows the vaporized moisture to "outgas" from the vias. Trapped vaporized moisture may cause delamination and degradation of the package. Therefore it would be desirable to have a BGA package that provides optimum routing space and allows outgassing from the vias.

SUMMARY OF THE INVENTION

The present invention is a ball grid array (BGA) integrated circuit package which has a via that is connected to a solder pad of a package substrate. The via has a portion located within the solder pad to increase the routing space of the substrate, and a portion located outside the solder pad to allow outgassing from the via.

BRIEF DESCRIPTION OF THE DRAWINGS

FIG. 8 is a bottom view of an alternate embodiment of the package;

FIG. 9 is a cross-sectional view of the package shown in FIG. 8.

DETAILED DESCRIPTION OF THE INVENTION

Figure 1:
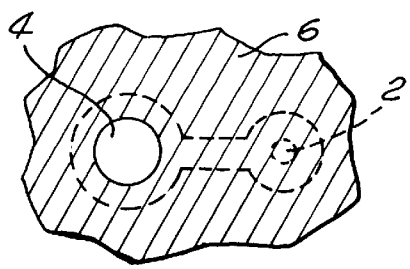
FIG. 1 is a bottom view of an integrated circuit package of the prior art showing a "dogbone" solder pad configuration.
Figure 3:
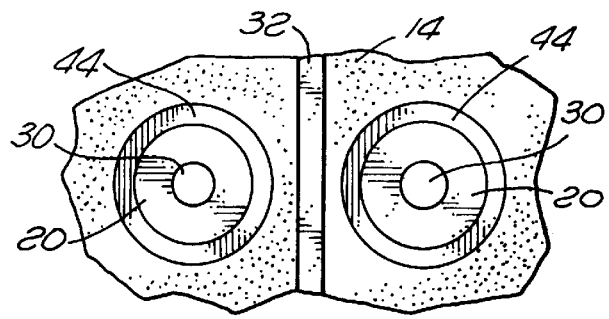
FIG. 3 is a bottom view of the package.
Figure 2:
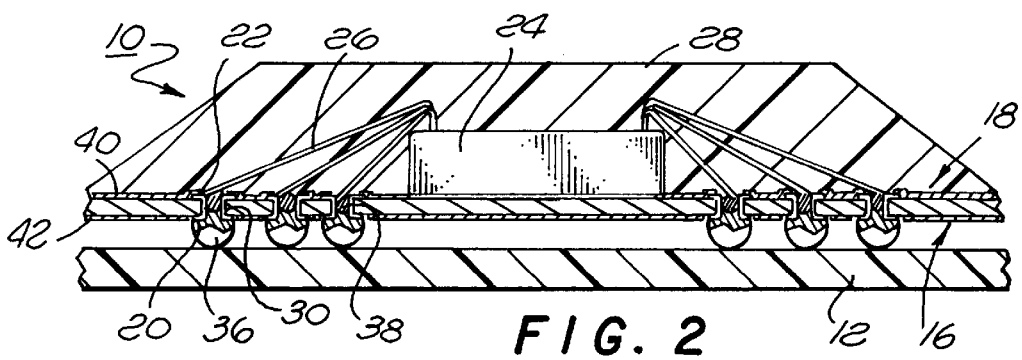
FIG. 2 is a cross-sectional view of a ball grid array package of the present invention.

Referring to the drawings more particularly by reference numbers, FIGS. 2 and 3 show an integrated circuit package 10 of the present invention. The package 10 is typically soldered to an external printed circuit board 12. The package 10 contains a substrate 14 which has a first surface 16 and an opposite second surface 18. The substrate 14 contains both dielectric and conductive material which route electrical power and signals across and through the substrate. The substrate 14 has a center dielectric layer constructed from a flexible polyimide or a rigid epoxy material. The first 16 and second 18 surfaces of the substrate 14 have layers of copper that are etched into desired routing and bus patterns.

The first surface 16 of the substrate 14 has a plurality of solder pads 20. The second surface 18 of the substrate 14 has a plurality of bonding pads 22. The bonding pads 22 are connected to an integrated circuit 24 that is mounted to the substrate 14. The pads 22 and integrated circuit 24 are typically connected by bonding wires 26. Although bonding wires 26 are shown and described, it is to be understood that the components 22 and 24 can be connected by other means such as a tape automated bonding (TAB) tape. Additionally, although an integrated circuit is shown and described, it is to be understood that the package may contain any passive or active electrical device. The integrated circuit 24 and second surface 18 of the substrate 14 are typically covered with a outer shell 28. The shell 28 may be an epoxy or a plastic molded after the integrated circuit is mounted and attached to the substrate 14.

Figure 4:
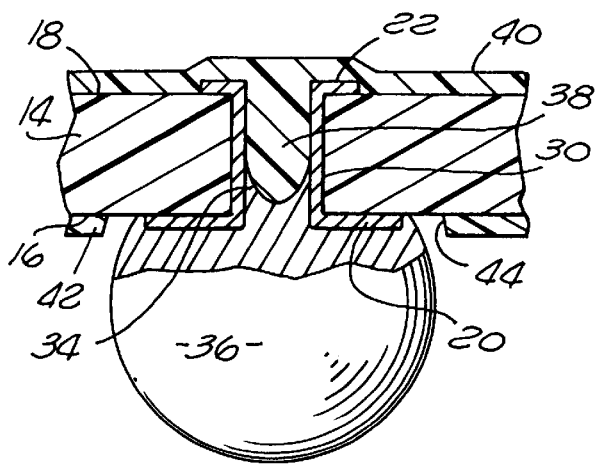
FIG. 4 is an enlarged cross-sectional view of a substrate of the package.

As shown in FIG. 4, the bonding pads 22 are connected to the solder pads 20 by vias 30. The vias 30 terminate within the area of the solder pads 20. Although the vias 30 are shown concentrically located with the pads 22, it is to be understood that the vias 30 may be off-center. As shown in FIG. 3, by placing the vias 30 within the solder pads 20, the substrate 14 of the present invention provides additional routing space on the first surface 16. The routing space allows conductive traces 32 to be routed along the first surface 16 of the substrate 14. This is to be distinguished from prior art BGA packages which separate the vias from the solder pads in a dogbone configuration that occupies more surface area for each pair of solder pads and vias.

Referring to FIG. 4, the vias 30 are typically formed by initially drilling holes into the dielectric material of the substrate and then plating conductive material such as copper into the holes. The formation of the vias 30 typically results in a longitudinal channel 34 through the center of each via 30. Although the board shown in FIG. 4 has external routing layers, it is to be understood that the board may also have internal routing layers.

A solder ball 36 is attached to each solder pad 20 of the substrate 14. The solder balls 36 are typically attached to the solder pads 20, by initially placing a ball onto the pad 20 typically with a vacuum chuck tooling device. The first surface 16 of the substrate 14 is in an upright position so that the solder balls 36 do not fall off of the substrate 14. The solder balls 36 are subsequently heated so that the solder reflows and becomes attached to the solder pads 20. The solder balls 36 are subsequently soldered to corresponding surface pads (not shown) of the printed circuit board 12 to attach the package 10 to the board 12.

To prevent the solder balls 36 from wicking and flowing into the via 30, a solder mask plug 38 is created within the longitudinal channels 32. The solder mask plug 38 can be created by applying a layer of solder mask 40 to the second surface 18 of the substrate 14. In the uncured state, the solder mask is fluid so that a portion of the mask material flows into the channels 34 of the vias 30. Openings (not shown) are formed in the mask 40 to allow the bonding pads 22 to become attached to the integrated circuit 24.

To prevent cross-wicking of solder between the solder pads 20, the first surface 16 of the substrate 14 may have a layer of solder mask 42. As shown in FIG. 3, the solder mask 42 has a plurality of openings 44 that allow the solder balls 36 to wick onto the solder pads 20. The openings 44 typically have a diameter larger than the diameter of the solder pads 20. The smaller diameter solder pads 20 also provides additional routing space on the first surface 16 of the substrate 14.

Figure 5:
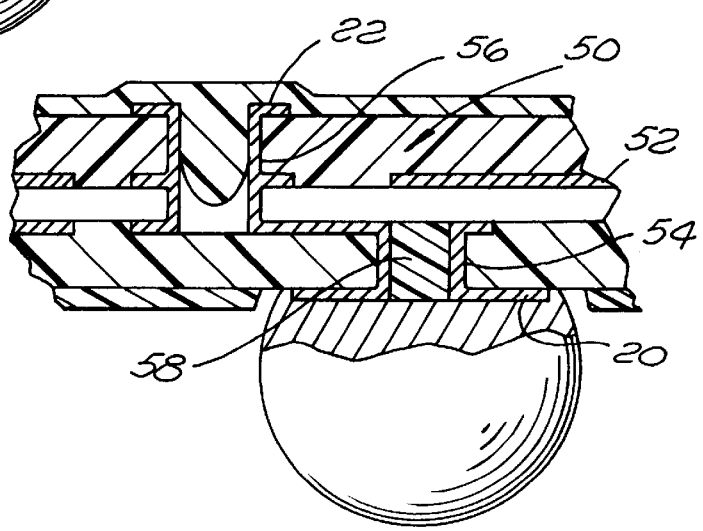
FIG. 5 is an enlarged cross-sectional view of an alternate embodiment of the substrate.

FIG. 5 shows an alternate embodiment of a multi-layered substrate 50 has internal conductive layers 52 that increase the routing density of the substrate 50. One of the internal layers 52 may be connected to a "blind" via 54 that terminates into the solder pad 20. The internal layer 52 may also be connected to a second via 56 that is connected to a bonding pad of the substrate 50. The blind vias 54 terminate within the solder pads to optimize the routing space on the first surface of the substrate. The via 54 may have a resin plug 58 located therein.

Figure 6:
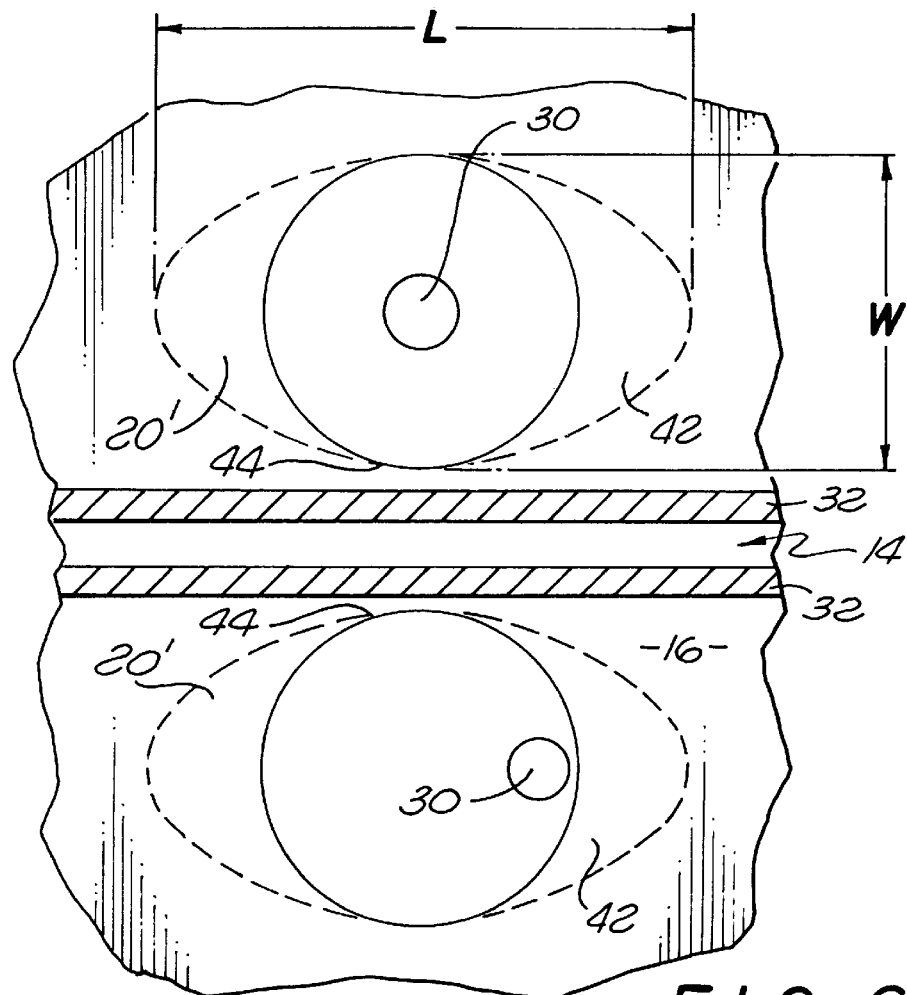
FIG. 6 is a bottom view of an alternate embodiment of the package.

FIG. 6 shows an alternate embodiment of a package that has elliptical shaped solder pads 20'. The elliptical shaped pads 20' have a width W that is less than a length L of the pads. The narrower width provides more routing space between the solder pads. The additional routing space allows more conductive traces 32 to be routed along the first surface 16 of the substrate 14.

Figure 7:
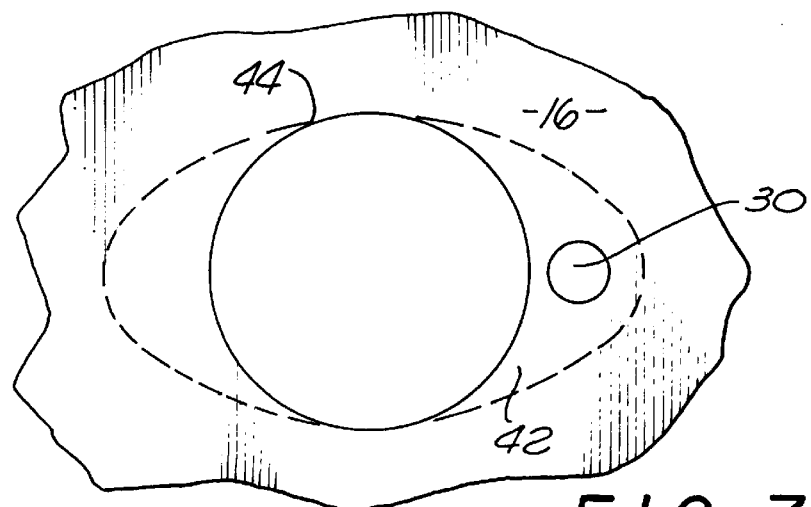
FIG. 7 is a bottom view of an alternate embodiment of the package.

The solder mask openings 44 have a diameter that is less than the length of the elliptical shaped solder pads 20'. In the preferred embodiment, each opening 44 has a diameter that is approximately equal to the width of each elliptical pad 20'. Portions of the solder pads 20' are covered by the solder mask 42. The maskant material provides additional structural support for the solder pads 20' to increase the peel strength of the pads 20'. The vias 30 can be located at the center of the solder pads 20', or at a location that is offset from the center of the solder pads 20', either exposed by the solder mask opening 44, or beneath the solder mask 42 as shown in FIG. 7.

FIGS. 8 and 9 show an alternate embodiment, wherein the via 30 is located on the first surface 16 of the substrate 14 so that a portion of the via 30 is within the solder pad 20 and a portion of the via 30 is outside the solder pad 20. Locating a portion of the via 30 inside the solder pad 30 increases the routing space across the first surface 16. Locating a portion of the via 30 outside the solder pad 30 allows gasses to escape the barrel of the via 30. The solder mask 42 covers the via 30 but exposes the solder pad 20 so that a solder ball 36 can be attached to the pad 20. Part of the solder mask 42 extends beyond via 30 to compensate for tolerances and insure that the solder ball does not flow into the via 30. Although having solder mask 42 on the solder pad 20 reduces the solder area for the solder balls 42, there is enough exposed pad 20 area to insure good solder integrity. In the preferred embodiment, the center of the via 30 is located at approximately the outer radius of the solder pad 20.

What is claimed is:

1. A ball grid array package, comprising:
   a substrate that has a first surface;
   a solder pad located on said first surface;
   a via which has a portion located within said solder pad and a portion located outside said solder pad; and,
   a solder ball that is attached to said solder pad.

2. The package as recited in claim 1, wherein said via has a center located at an outer radius of said solder pad.

3. The package as recited in claim 1, further comprising a solder mask located on said first surface, said solder mask having an opening that exposes said solder pad and covers said via.

4. The package as recited in claim 1, further comprising a routing trace that is located between two solder pads.

5. An integrated circuit ball grid array package, comprising:

a substrate that has a first surface and a second opposite surface;

a solder pad located on said first surface of said substrate;

a via which has a portion located within said solder pad and a portion located outside said solder pad;

a solder ball that is attached to said solder pad; and, an integrated circuit that is mounted to said second surface of said substrate and coupled to said via.

6. The package as recited in claim 5, wherein said via has a center located at an outer radius of said solder pad.

7. The package as recited in claim 5, further comprising a solder mask located on said first surface, said solder mask having an opening that exposes said solder pad and covers said via.

8. The package as recited in claim 5, further comprising a routing trace that is located between two solder pads.

9. A method for constructing an electronic package, comprising the steps of:

a) forming a substrate which has solder pad and a via that has a portion within said solder pad and a portion outside said solder pad;

b) applying a solder mask to said substrate to cover said via and expose said solder pad; and, c) attaching a solder ball to said solder pad.

10. The method as recited in claim 9, further comprising the steps of mounting an integrated circuit to a second surface of said substrate and coupling said integrated circuit to said via.

* * * * *